(12) United States Patent
Budde et al.

(10) Patent No.: US 6,728,073 B1
(45) Date of Patent: Apr. 27, 2004

(54) FLEXIBLE CIRCUIT DESIGNS WITH IMPROVED DAMPING

(75) Inventors: Richard August Budde, Plymouth, MN (US); David Allen Sluzewski, Edina, MN (US)

(73) Assignee: Seagate Technology LLC, Bloomington, MN (US)

( * ) Notice: Subject to any disclaimer, the term of this patent is extended or adjusted under 35 U.S.C. 154(b) by 60 days.

(21) Appl. No.: 09/711,357

(22) Filed: Nov. 9, 2000

Related U.S. Application Data (60) Provisional application No. 60/175,570, filed on Jan. 11, 2000.

(51) Int. Cl.[7] .............................................. G11B 21/16
(52) U.S. Cl. ................................................... 360/245.9
(58) Field of Search ........................ 360/244.9, 244.3, 360/245.9, 265.9, 246.6

(56) References Cited

U.S. PATENT DOCUMENTS

| | | | |
|---|---|---|---|
| 4,760,478 A | 7/1988 | Pal et al. | |
| 4,819,094 A * | 4/1989 | Oberg | |
| 5,145,553 A | 9/1992 | Albrechta et al. | 156/640 |
| 5,185,683 A | 2/1993 | Oberg et al. | |
| 5,526,208 A * | 6/1996 | Hatch et al. | 360/245 |
| 5,701,218 A | 12/1997 | Boutaghou | |
| 5,796,556 A | 8/1998 | Boutaghou | |
| 5,825,590 A * | 10/1998 | Ohwe | 360/244.9 |
| 5,883,759 A | 3/1999 | Schulz | |
| 5,909,342 A * | 6/1999 | Forbord et al. | |
| 5,940,251 A * | 8/1999 | Giere et al. | 360/244.9 |
| 5,943,191 A * | 8/1999 | Giere et al. | 360/244.9 |
| 5,949,617 A * | 9/1999 | Zhu | 360/244.9 |
| 5,953,180 A * | 9/1999 | Frater et al. | 360/244.9 |
| 5,955,176 A | 9/1999 | Erpelding et al. | 428/209 |
| 6,268,981 B1 * | 7/2001 | Coon et al. | 360/244.3 |
| 6,271,996 B1 * | 8/2001 | Houk et al. | 360/244.9 |
| 6,313,972 B1 * | 11/2001 | Williams et al. | 360/245.3 |

\* cited by examiner

*Primary Examiner*—Allen Cao
(74) *Attorney, Agent, or Firm*—Kinney & Lange, P.A.

(57) ABSTRACT

A flex circuit for use in a head gimbal assembly having additional polyamide features which improve the damping properties of the flex circuit. An elbow or damping strips with or without metal traces can be added to the flex circuit to dampen the first torsion gain. The elbow or damping strips with or without metal traces do not act as a substrate for electrical circuitry, but rather provide damping properties to the head gimbal assembly.

17 Claims, 11 Drawing Sheets

FIG. 1

FIG. 2
_PRIOR ART_

FIG. 15

FLEXIBLE CIRCUIT DESIGNS WITH IMPROVED DAMPING

CROSS-REFERENCE TO RELATED APPLICATION(S)

This application claims priority from provisional application No. 60/175,570 filed Jan. 11, 2000 for "Flexible Circuit Designs with Improved Damping Properties" by Richard A. Budde and David A. Sluzewski.

BACKGROUND OF THE INVENTION

The present invention relates to a head gimbal assembly of a disc drive, and more particularly, to a flexible interconnect circuit with improved damping properties for use in a head gimbal assembly.

Disc drives are well known in the art and comprise several discs, each disc having several concentric data tracks for storing data. A transducing head carried by a slider is used to read from or write to a data track on a disc. The slider is located on an actuator arm, and glides above the surface of the disc as the disc is spun. The slider is positioned above a data track on the disc by moving the actuator arm on which the slider is suspended using a large scale actuation motor, such as a voice coil motor.

The slider is mounted on the actuator arm using a head gimbal assembly (HGA). A standard HGA comprises a load beam, a gimbal, a flexible interconnect circuit, and the slider. The load beam provides the main support structure for the HGA. The gimbal is attached under the load beam, and the slider is attached to the gimbal. The gimbal is designed to allow the slider to follow the surface of the disc more closely than if the slider were mounted directly on the load beam. The flexible interconnect circuit is laid on top of the load beam and provides the circuitry to and from the head in the form of leads and traces. The leads and traces connect the flexible interconnect circuit to the slider and thus allow electronic signals to pass between the transducing head carried on the slider and the flexible interconnect circuit.

As the slider is moved by the actuator arm, the HGA experiences vibrations and reaches certain structural resonances. At structural resonances, the HGA begins to move wildly, which adversely affects the performance of the transducing head. Of particular concern is the first torsion resonance experienced by the HGA at a frequency of approximately 3,700 hertz.

Some structural resonances of the HGA's are inevitable. Other resonance modes, in particularly the first torsion resonance, are controlled using damping methods. Past attempts at damping the structural resonance of the HGA, and in particular the first torsion resonance, involved adding a Mylar damper to the HGA. Mylar dampers have a self adhesive backing and are applied to the surface of the flex circuit. The adhesive on the damper acts to absorb the energy from the resonance, which results in reduced vibration of the HGA.

Due to the small size of the HGAs, applying the Mylar dampers creates complications and challenges during the manufacturing of the HGAs. In addition to requiring a separate piece part, additional assembly process steps are required, both of which increase the cost of the HGAs. Thus, there is a need in the art for a damping method which is simple to manufacture and inexpensive to incorporate into the assembly of HGAs.

BRIEF SUMMARY OF THE INVENTION

The present invention relates to a damping method for damping the first torsion resonance in HGAs. By redesigning the flex circuit on the HGA to include an elbow or damping strips, it is possible to dampen the first torsion resonance without affecting the pre-load force on the load beam or making other resonance modes worse. This small design change in the flex circuit is inexpensive and can be incorporated into the manufacturing of the HGA without requiring a separate piece part or an additional assembly step.

DETAILED DESCRIPTION

Figure 1:
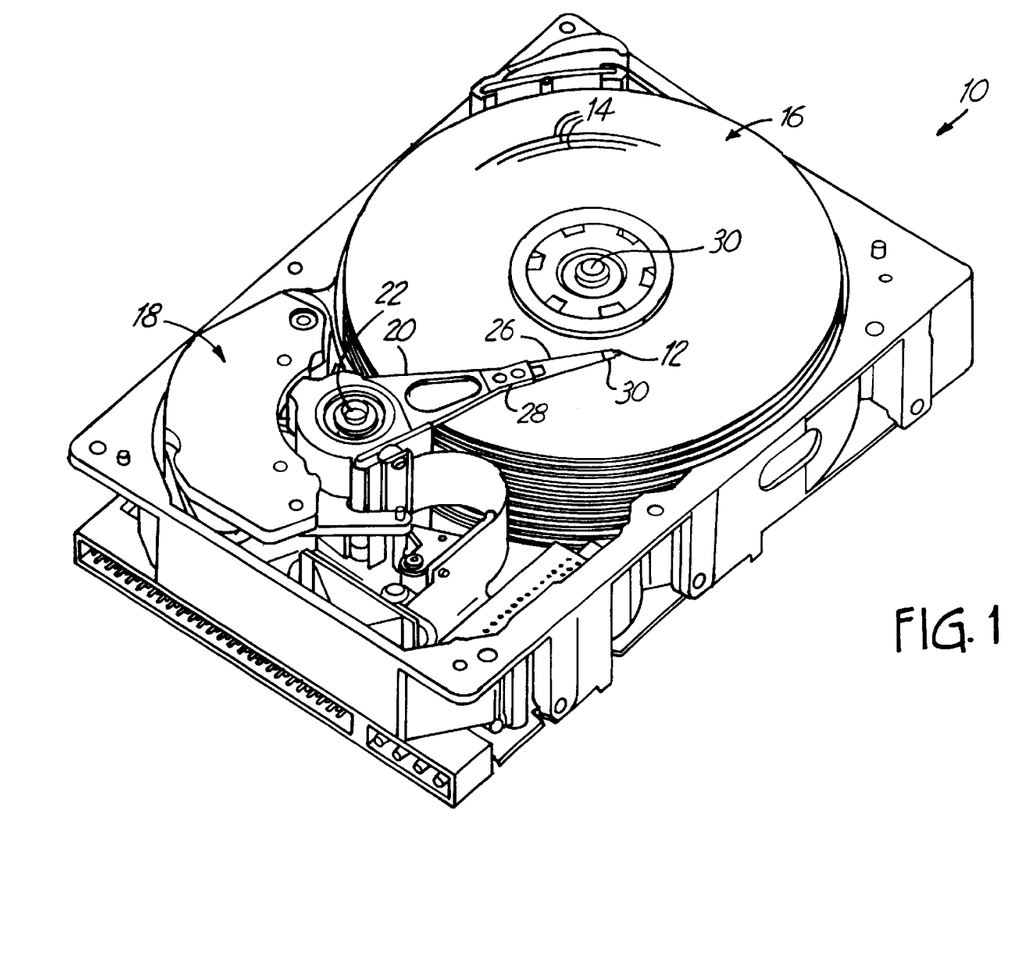
FIG. 1 is a perspective view of a disc drive actuation system for positioning a slider over tracks of a disc.

FIG. 1 is a plan view of a disc actuation system 10 for positioning a slider 12 over a selected data track 14 of a disc 16. The actuation system 10 includes a voice coil motor (VCM) 18 arranged to rotate actuator arm 20 around axis 22 on spindle. The head suspension includes a load beam 26 connected to the actuator arm 20 at a head mounting block 28. A gimbal 30 is connected to an end of the load beam 26, and carries the slider 12. The slider 12 carries a transducing head for reading from or writing to the concentric tracks 14 of the disc 16. The disc 16 rotates about an axis 30 so that windage is encountered by the slider 12 to keep it aloft a small distance above the surface of disc 16.

The distance the slider 12 "flys" above the surface of the disc 16 is called the fly height. The fly height of the slider 12 affects the performance of the transducing head and is controlled very tightly. As the VCM 18 moves the actuator arm 20 to position the slider 12 over various tracks 14 of the disc 16, the arm 20 and load beam 26 vibrate and reach certain natural resonance frequencies. Such vibrations and resonance modes affect the fly height and flight stability of the slider. To ensure the transducing head is able to function properly, it is desirable to minimize any resonance experienced by the HGA. In particular, it is desirable to minimize the first torsion resonance mode experienced by the HGA.

Figure 2:
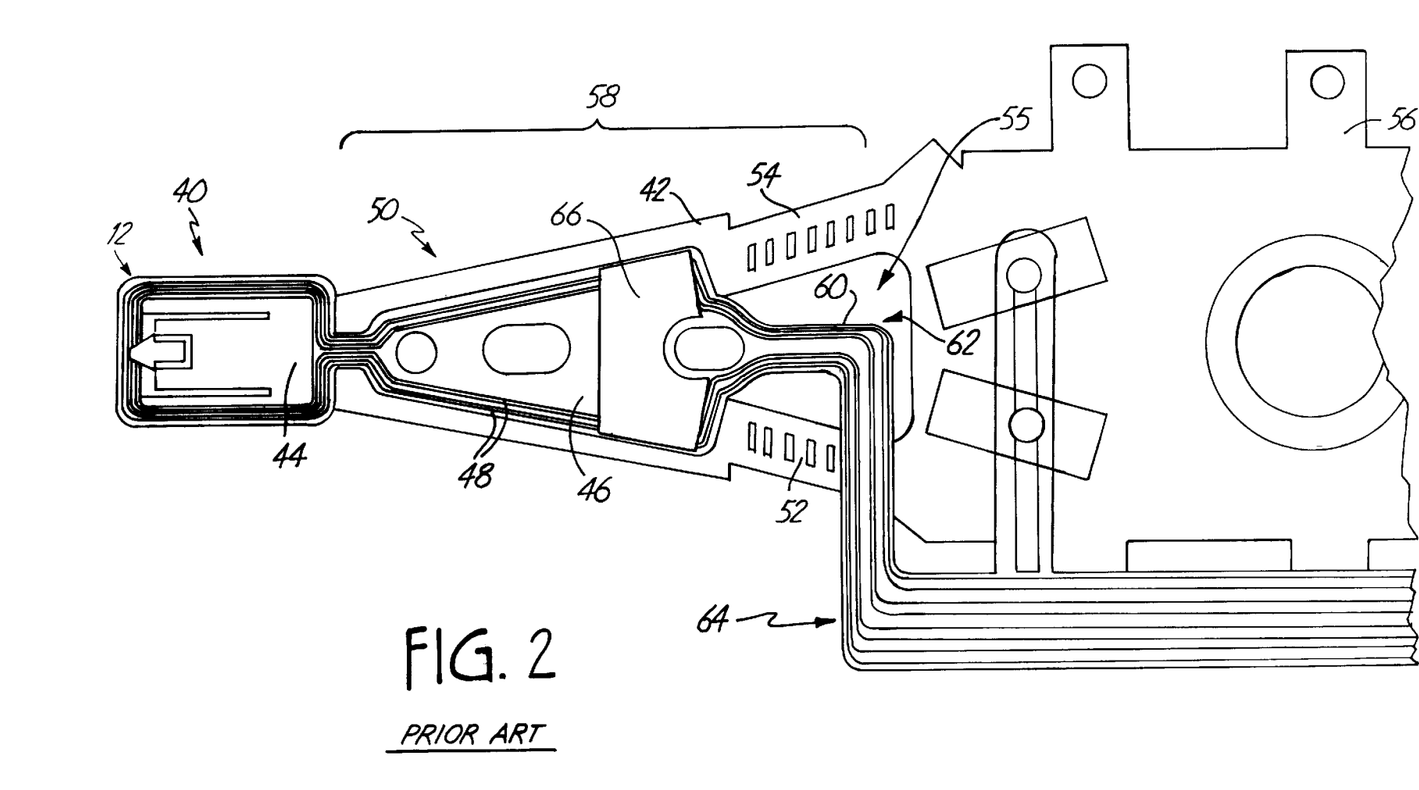
FIG. 2 is a top plan view of a load beam and flex circuit having a center route.

FIG. 2 is a top plan view of a prior art head gimbal assembly (HGA) 40. The HGA 40 comprises a load beam 42, a gimbal 44, and a flexible interconnect circuit ("flex circuit") 46. The gimbal 44 is mounted on the underside of the load beam 42 and the flex circuit 46 is positioned on the top surface of the load beam 42 in a manner known in the art. The slider 12 is attached to the gimbal 44, which functions to impart more flexibility to the slider 12 than if the slider 12 were attached directly to the load beam 42. The flex circuit 46 provides the circuitry for connecting to the slider 12 and is typically configured of a polyamide substrate with copper or gold traces 48. The traces 48 allow electronic signals to be passed between the flex circuit 46 and the transducing head located on the slider 12.

The load beam 42 provides the main support structure for the slider 12 and comprises a body section 50, pre-load bend rails 52, 54, a cut out 55, and base plate 56. The cut-out 55 is located between the body 50 and the base plate 56 of the load beam 42. The rails 52, 54 connect the body 50 to the base plate 56, and the base plate 56 in turn connects the load beam 42 to the head mounting block 28 (FIG. 1). The load beam 42 has a pre-load region 58 which is that portion of the load beam 42 having a slight bend created by the pre-load bend rails 52, 54. The pre-load region 58 biases the slider 12 toward the surface of the disc, and this pre-load bias is very important for controlling the fly height of the slider. Thus, the pre-load of the load beam 42 must be controlled very tightly.

The flex circuit 46 is bonded to the load beam 42 in a conventional manner. Traces 48 on the flex circuit 46 are routed along the outer edges of the flex circuit 46 and end in a tail 60. The tail 60 of the flex circuit 46 extends off of the body 50 of the load beam 42 where it becomes unsupported by the load beam 42. The tail 60 extends through the center of the cut out 55 and forms a first right angle turn 62 just before the front (as viewed in FIG. 2) of the base plate 56. After the first turn 62, the tail 60 extends downward (as viewed in FIG. 2) along the front of the base plate 56 until the tail 60 takes a second right angle turn 64 near the bottom (as viewed in FIG. 2) of the base plate 56. The tail 60 then extends along the bottom of the base plate 56, eventually connecting to circuitry located further down the actuation arm. The path of the tail 60 illustrated in FIG. 2 may be referred to as a "center route" path because the tail 60 extends through the center of the cut out 55.

In an attempt to dampen the vibration and structural resonance of the HGA 40, a damper 66 is adhered to the flex circuit 46 on the body 50 of the load beam 42. The damper 66 is typically self adhesive with a form of visco-elastic adhesive so that when the damper 66 is applied to the flex circuit 46, the adhesive on the damper 66 absorbs the energy associated with the natural resonant frequency. Other forms of external dampers have been utilized to deal with the structural resonances experienced by the HGA's 40. However, applying the external damper 66 creates an extra step in the manufacturing process and adds to the material cost of the HGA 40.

Figure 3:
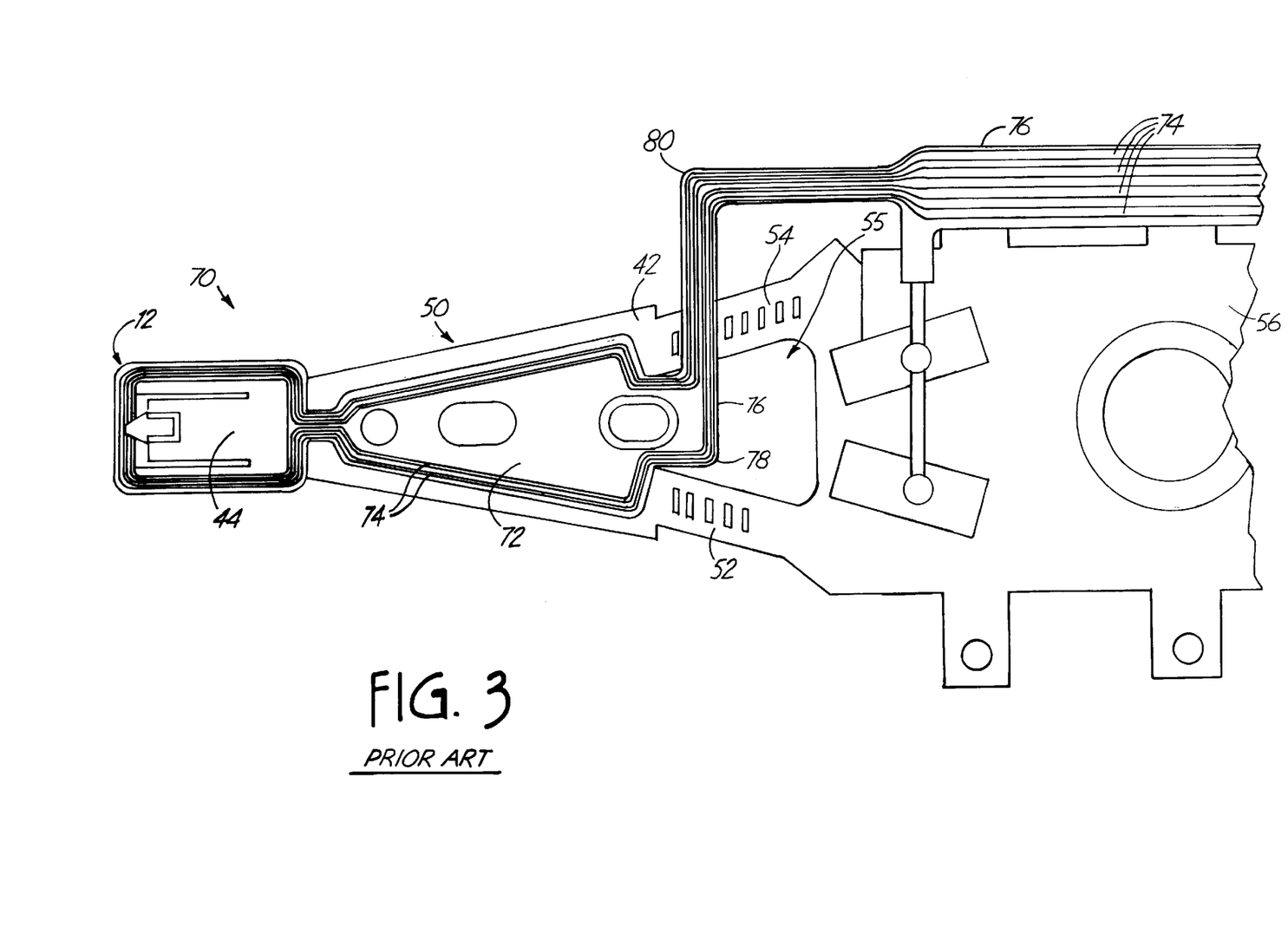
FIG. 3 is a top plan view of a load beam and Flex circuit having a side route.

FIG. 3 shows a head gimbal assembly 70 with load beam 42, gimbal 44, and flex circuit 72. The load beam 42 comprises body 50, pre-load bend rails 52, 54, cut-out 55, and base plate 56, just as in FIG. 2. However, the flex circuit 72 of FIG. 3 is slightly different from the flex circuit 46 of FIG. 2. Tile flex circuit 72 in FIG. 3 is once again formed of a polyimide substrate having copper or gold traces 74 for connecting to the transducer head on slider 12. The traces 74 on the flex circuit 72 travel a different path between the body 50 of the load beam 42 and the base plate 56.

A tail 76 extends off the body 50 of the load beam 42 and immediately takes a first right angle turn 78 in the cut-out 55 just behind the body 50 of the load beam 42 (as viewed in FIG. 3). After the first turn 78, the tail 76 extends upward, over the top rail 54 and off the load beam 42 where the tail 76 forms an elbow 80 unsupported by the load beam 42. The elbow 80 of the tail 76 creates a second right angle turn so that the tail 76 extends horizontally to the top of the base plate 56 (as viewed in FIG. 3) where the traces 74 eventually connect to circuitry located further down the actuation arm. The path of the tail 76 illustrated in FIG. 3 may be referred to as a "side route" path because the tail 76 extends not through the center of the cut out 55, but off to one side of the cut out 55.

It was discovered that HGA's having flex circuits 70 with side route tails 76 and elbows 80 experience a lower first torsion gain. However, the elbow 80 affects the HGA in other ways, including the creation of a different resonance mode caused by the flapping of elbow 80. In addition, the elbow 80 affects the pre-load of the load beam 50, which in turn can affect the fly height and flight stability of the slider 12 above the disk.

Figure 4:
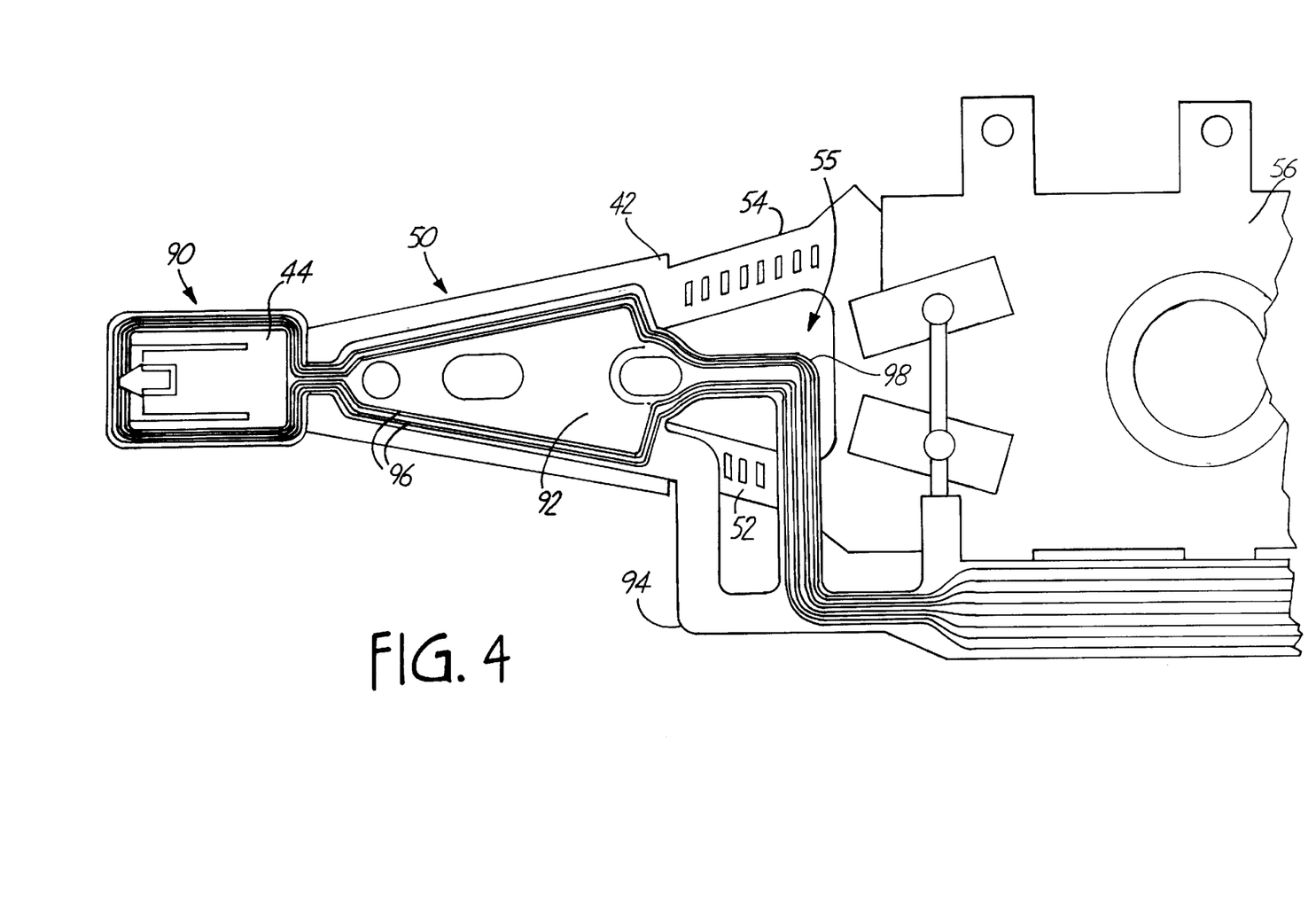
FIG. 4 is top plan view of a load beam and Flex circuit having an elbow.

FIGS. 4–7 show alternate designs of flexible circuits which address both the desire to dampen the first torsion gain while not affecting the pre-load of the load beam. FIG. 4 is a top plan view of a head gimbal assembly 90 with load beam 42 and gimbal 44. The load beam 42 comprises on the body 50, rails 52, 54, cut-out 55, and base plate 56. Located on the load beam 42 is a flex circuit 92 with an elbow 94. The flex circuit 92 is once again formed of a polyamide substrate having copper or gold traces 96 for connecting to the transducing head on the slider 12. The traces 96 extend from the body 50 of the load beam 42 to the base plate 56 on a center route tail 98.

The elbow 94 on the flex circuit 92 is formed from the polyamide substrate but does not contain any traces 96. Thus, though similar to a side route tail, the elbow differs in that it does not act as a substrate for circuitry. Rather, the elbow 94 merely acts to enhance the damping properties of the flex circuit 92. The elbow 94 extends generally downward off the lower rail 52 (as viewed in FIG. 4) where it becomes unsupported by the load beam 42. The elbow 94 connects to the tail 98 near the base plate 56. The elbow 94 is not bonded to the rail 52. The elbow 94 successfully dampens the first torsion gain without adversely affecting the pre-load of the load beam 42.

Figure 5:
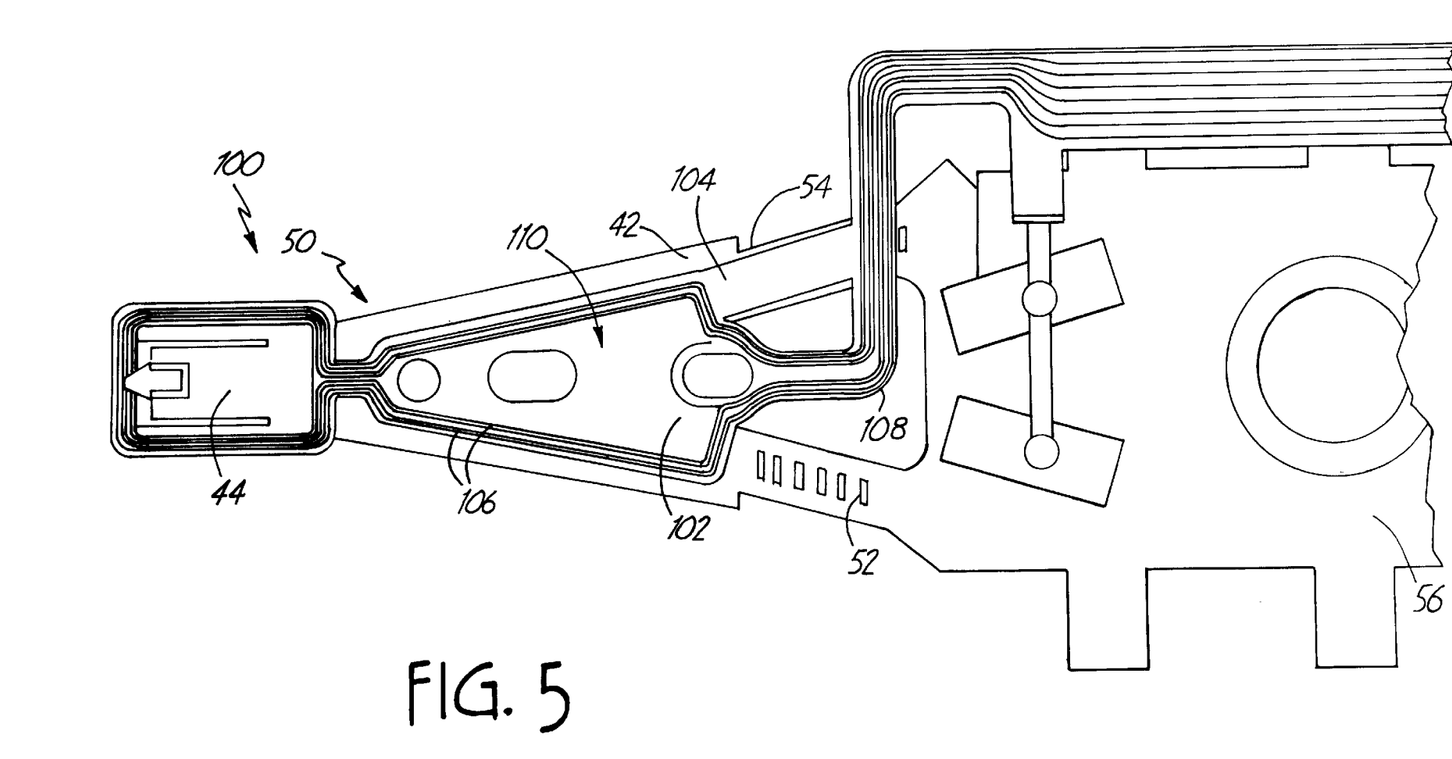
FIG. 5 is a top plan view of a load beam and Flex circuit having a wide damping strip on a rail of the load beam.

FIG. 5 is a top plan view of an HGA 100 with load beam 42 and gimbal 44. Located on the load beam 42 is a flex circuit 102 with a wide damping strip 104. The flex circuit 102 is once again formed of a polyamide substrate having gold or copper traces 106 for connecting to the transducing head on the slider 12. The flex circuit 102 comprises a center route tail 108 connecting the traces 106 on the body 50 to the base plate 56.

The wide damping strip 104 extends along the top rail 54 of the load beam 42 and connects a body portion 110 of the flex circuit 102 to the circuitized tail 108. The wide damping strip 104 is not bonded to the load beam 42, nor does it contain any electrical traces. Rather, the wide damping strip 104 functions only to dampen the first torsion gain of the HGA 100.

Figure 6:
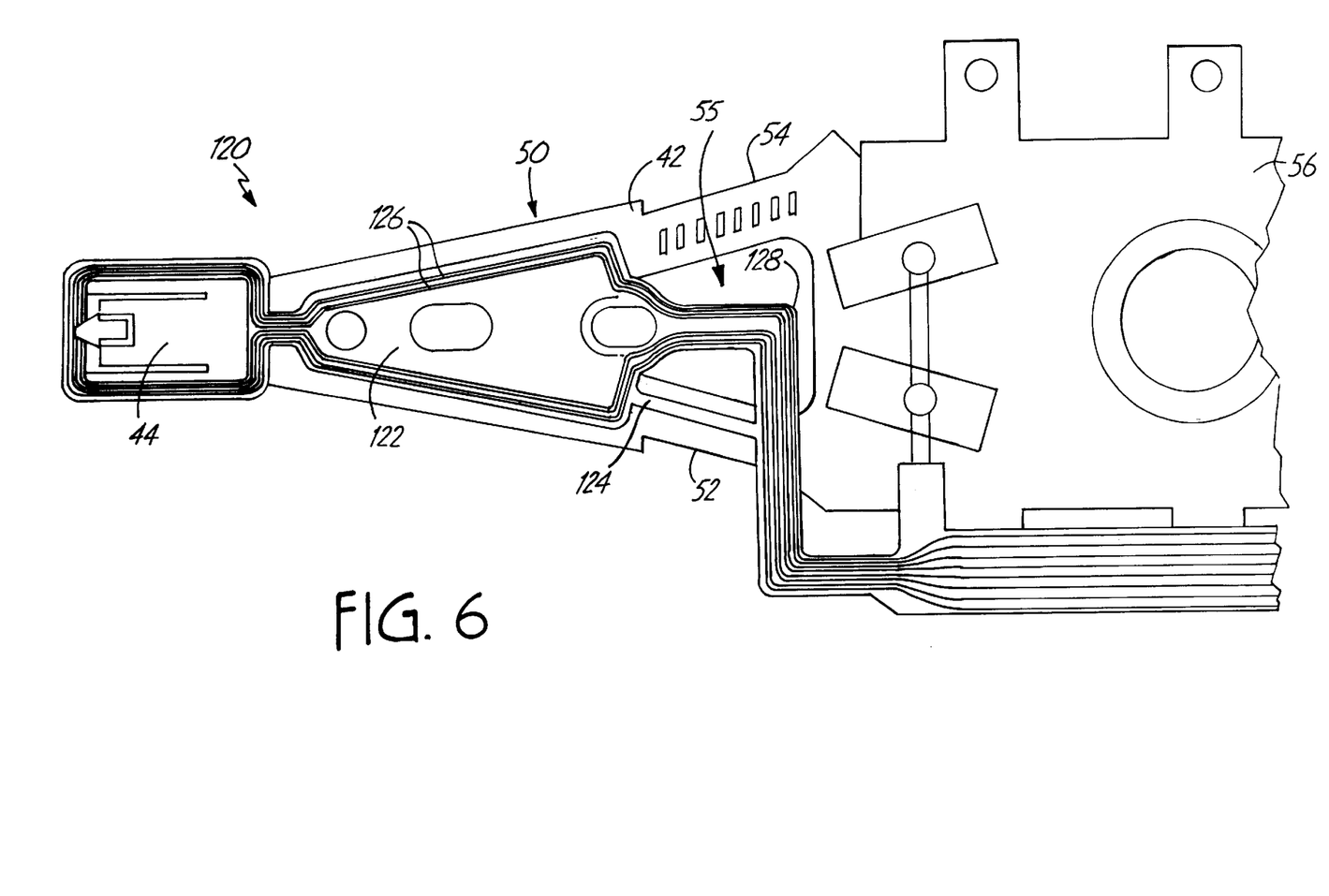
FIG. 6 is a top plan view of a load beam and Flex circuit having a narrow damping strap on a rail of the load beam.

FIG. 6 is a top plan view of an HGA 120 with load beam 42 and gimbal 44. Located on the load beam 42 is a flex circuit 122 with a narrow damping strip 124. The flex circuit 122 is once again formed of a polyamide substrate having gold or copper traces 126 for connecting to the transducing head on the slider 12. The flex circuit 122 comprises a center route tail 128 connecting the traces 126 on the body 50 to the base plate 56.

The narrow damping strip 124 extends along the bottom rail 52 of the load beam 42 and connects to the tail 128 on the bottom rail 52. The narrow damping strip 124 is not bonded to the load beam 42, but rather simply lays on the bottom rail 52. As can be seen by comparing the narrow damping strip 124 in FIG. 6 to the wide damping strip 104 in FIG. 5, the main difference between the two strips 124, 104 is their width.

Figure 7:
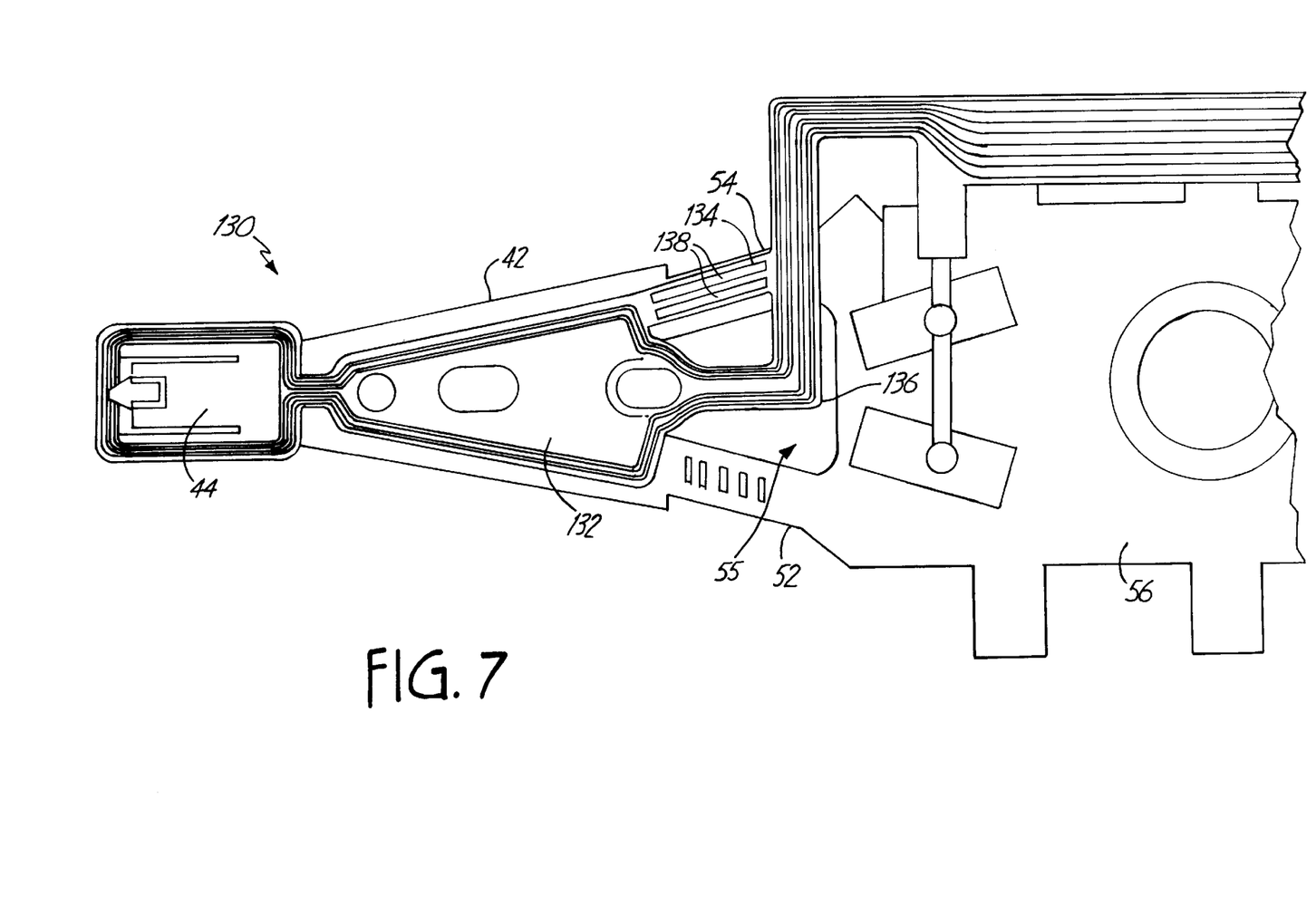
FIG. 7 is a top plan view of a load beam and Flex circuit having a narrow damping strip with non-functioning copper traces on a leg of the load beam.

FIG. 7 shows yet another alternate embodiment of an HGA 130 with a flex circuit 132 on the load beam 42. The flex circuit 132 comprises a narrow damping strip 134 located on the upper rail 54 of the load beam 42. The damping strip 134 connects to a center route tail 136 at the upper rail 54, and once again, the damping strip 134 is not bonded to the rail 54 of load beam 42. The damping strip 134 differs from the damping strips 104, 124 of FIGS. 5 and 6 in that the damping strip 134 further comprises copper traces 138. The traces 138 do not function as electrical circuitry, but rather add more stiffness to the damping strip 134.

The designs illustrated in FIGS. 5–7 involving damping strips formed from the polyamide substrate and located on the rails of the load beam address the fact that much of the deformation from the first torsion resonance occurs in the rails of the load beam. Thus, it was believed that applying damping strips over the rails, which experience much of the relative motion, would successfully dampen the resonance mode. However, the damping strips adversely affect the pre-load and the damping affect is not as high as expected.

Though all designs successfully dampen the first torsion gain, the design illustrated in FIG. 4 utilizing a polyamide elbow is preferred. The elbow design of FIG. 4 has a negligible effect on the pre-load, and yet successfully dampens the first torsion mode as desired. All of the designs can be easily implemented by designing the desired additional polyamide feature into the flex circuit with little or no additional costs. In addition, no additional process steps are needed for assembly.

Figure 8:
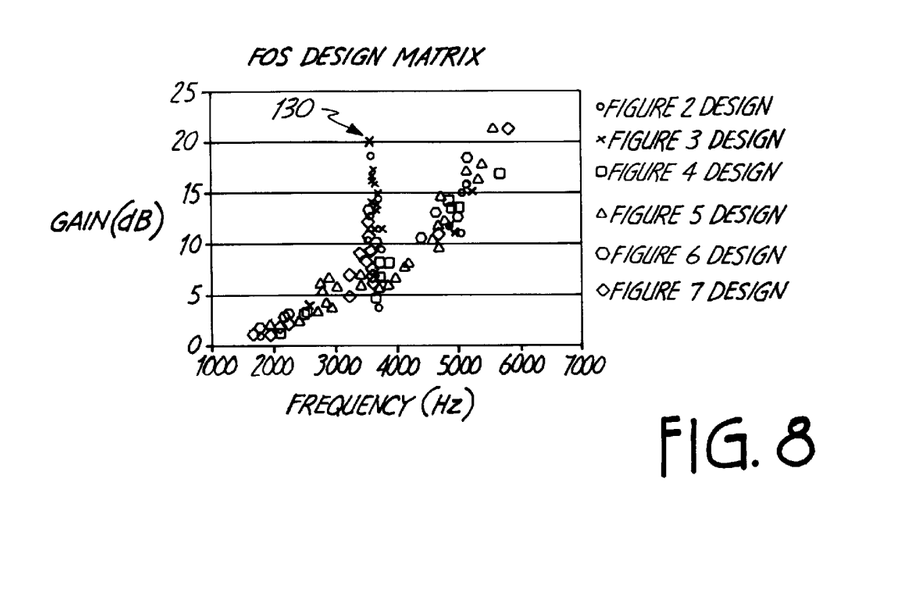
FIG. 8 is a graph of the Flex circuit design matrix plotting the frequency in Hertz versus the gain in decibels of the flex circuit designs disclosed in FIGS. 2 through 7.

To compare the performance of the designs disclosed in FIGS. 2–7. several tests were conducted to compare their damping affects. FIG. 8 is a graph plotting the frequency in Hertz versus the gain in Decibels of fifteen parts of each of the designs shown in FIGS. 2–7. As can be seen in FIG. 8, the first torsion mode 130 of the HGAs occurs at about 3,700 Hertz. Extra peaks may occur at other resonance modes. The design shown in FIG. 4, a bone, exhibited a low first torsion gain with relatively few extra peaks and as discussed above, was the preferred design.

Figure 9:
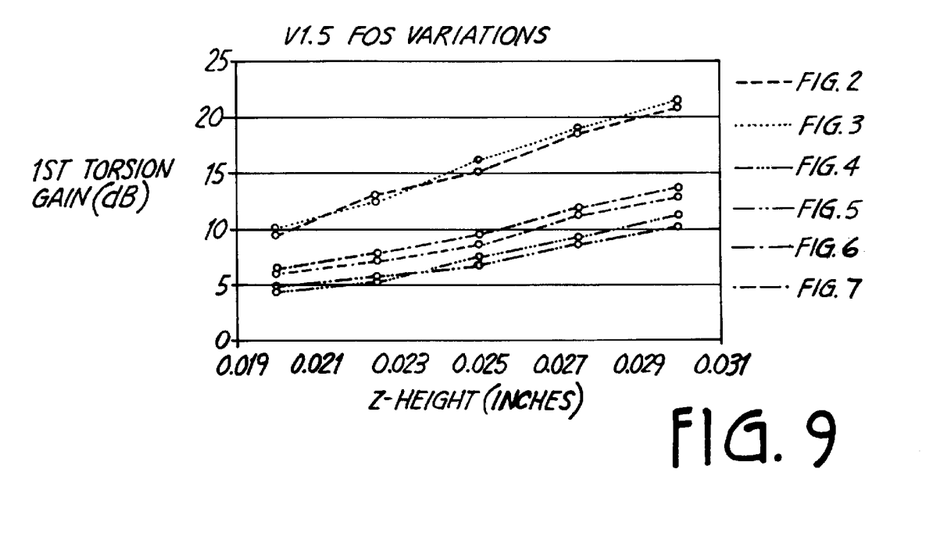
FIG. 9 is a graph illustrating the variation in flex circuit designs plotting the average first torsion gain in decibels versus the z-height response in inches.

FIG. 9 is a graph showing the z-height in inches versus the resonance for first torsion gain in decibels. Z-height refers to the height the head gimbal assembly is mounted above the surface of the disk. Because the HGA is mounted on the actuator arm, the z-height can be varied by moving the actuator arm relative to the surface of the disk. This relative height between the arm and the disk is known to affect the first torsion mode; the lower the z-height, the lower the first torsion gain. Ideally, the z-height should be around 20 hundredths of an inch above the disk. The graph shown in FIG. 9 plots the results of testing 5 HGAs of each of the designs shown in FIGS. 2–7 over a range of z-heights, showing the average first torsion gain versus z-height response. As can be seen by the graph in FIG. 9, the prior art methods of damping the first torsion gain, shown by the curves for the designs in FIGS. 2 and 3, are less effective than the designs shown in FIGS. 4–7 involving the addition of a polyamide elbow or polyamide damping strips to the flex circuit.

Figure 10:
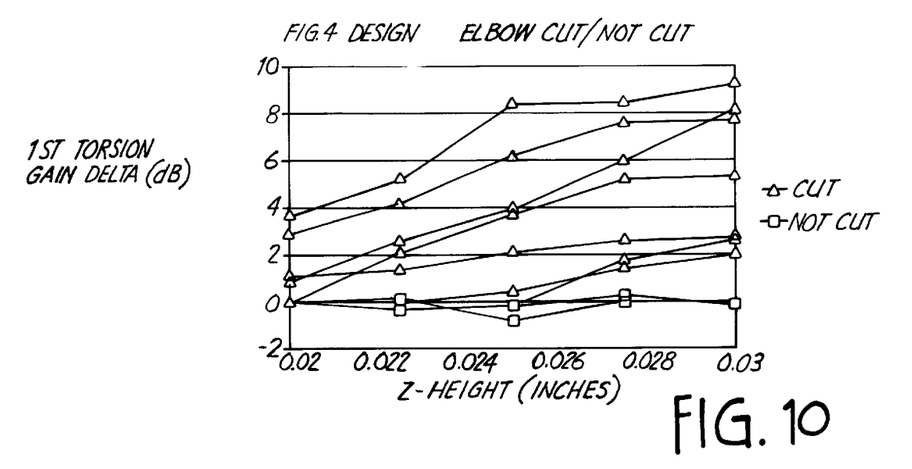
FIG. 10 is a graph showing additional testing of the flex circuit design disclosed in FIG. 4.

FIG. 10 is a graph showing additional testing of the design shown in FIG. 4 utilizing a polyamide elbow. Nine parts with this type of flex suspension were tested, seven of which had the polyamide elbow cut off and two of which still had intact elbows. All parts were tested twice at the same range of z-heights, once before the elbow was cut and once after the elbow had been cut. The difference in the first torsion gain from the first test to the second test is plotted on the graph shown in FIG. 10. The graph shows the gain change (delta) from the first test to the second test versus the z-height at which testing occurred. As can be seen in FIG. 10, the gain increased dramatically in those parts in which the elbow was cut. The parts where the elbow remained intact were kept as a control, and for such parts the z-height did not change noticeably. Thus, the polyamide elbow has a large effect on damping the first torsion gain.

Figure 11:
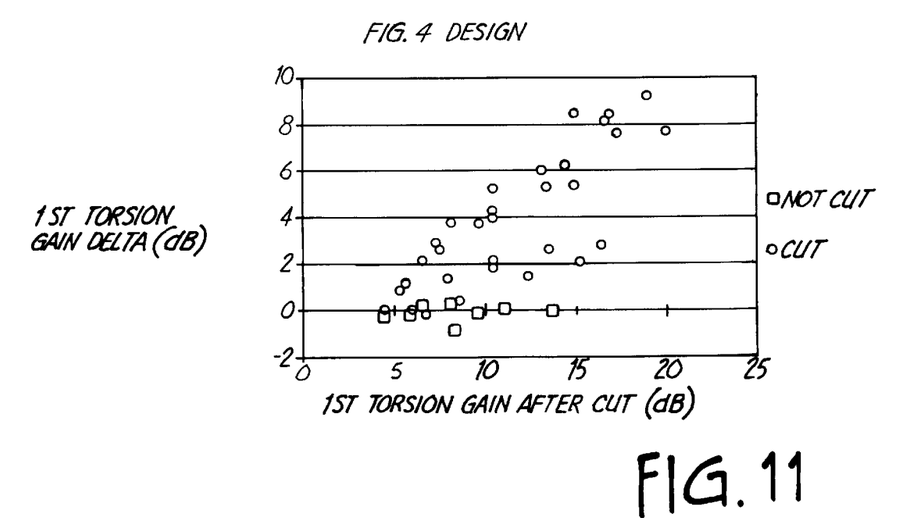
FIG. 11 is a graph plotting data of an additional test of the flex circuit design disclosed in FIG. 4 showing the first torsion gain delta versus the torsion gain after the elbow is cut off.

FIG. 11 shows the same data as that illustrated in FIG. 10, only plotted in a slightly different way. In FIG. 11, the first torsion gain after the elbow was cut is plotted against the first torsion gain (delta). As can be seen in FIG. 11, the gain reduction from the polyamide elbow is proportional to the gain in the part without the elbow. The gain reduction is about 40%, which is approximately the same reduction achieved using prior art Mylar self adhesive dampers.

Figure 12:
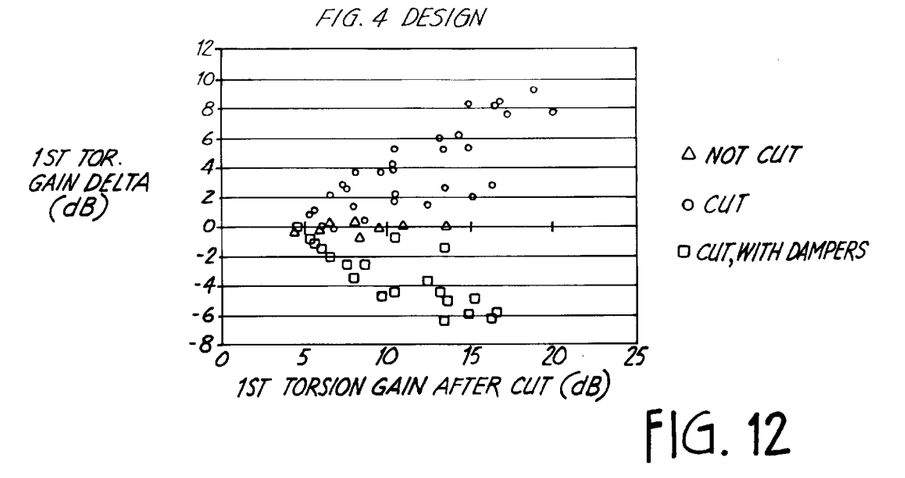
FIG. 12 is a graph showing additional testing of the flex circuit design disclosed in FIG. 4 after a Mylar damper has been applied to the parts having the elbow cut off.

FIG. 12 is a graph showing additional testing of the design shown in FIG. 4. The data illustrated in FIG. 12 resulted from applying a Mylar damper to five of the parts in which the polyamide elbow had been cut off. The parts were then resonance tested again at the same z-heights, and the change in resonance from before the damper had been applied to after the damper had been applied was determined. This data was added to the same graph as that shown in FIG. 11. As can be seen by the graph in FIG. 12, the Mylar damper reduces the first torsion gain by approximately the same amount the first torsion gain increased when the polyamide elbow was removed by cutting it off.

Figure 13:
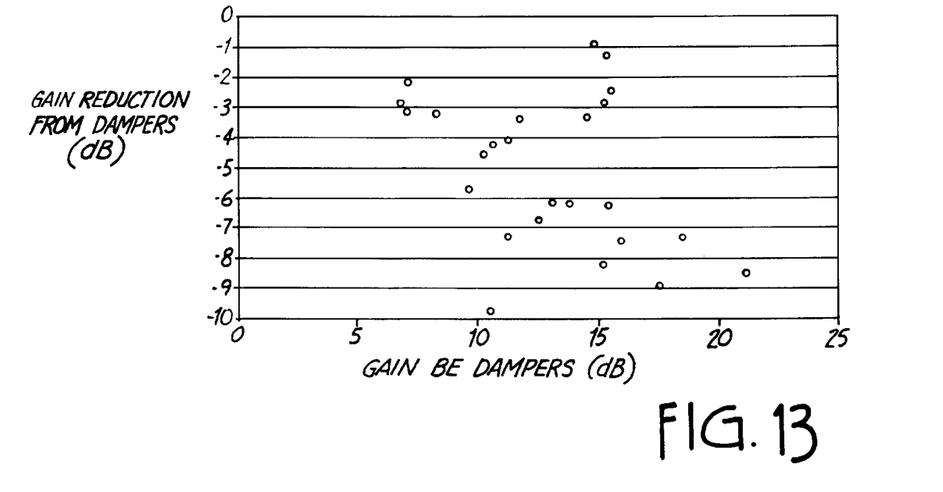
FIG. 13 is a graph illustrating the affects of applying dampers to the flex circuit design disclosed in FIG. 4 having intact elbows.

FIG. 13 is a graph illustrating the effects of applying dampers to the flex circuit design shown in FIG. 4 having intact elbows. Five of the parts with the design shown in FIG. 4 with intact elbows were selected and a Mylar damper was applied to determine whether there would be any additional damping benefits from the Mylar dampers. The graph in FIG. 13 shows the gain in decibels plotted against the gain reduction from the dampers in decibels. The results show that the Mylar dampers further reduce the gain about 40 percent.

Figure 14:
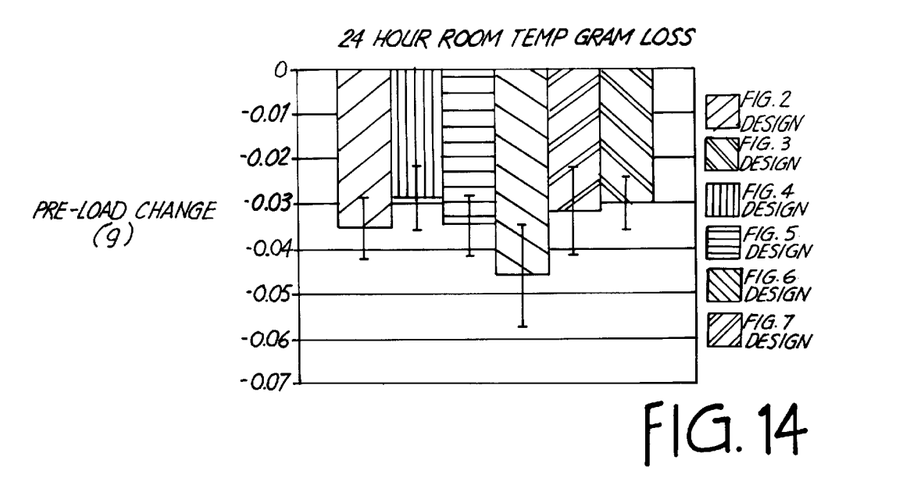
FIG. 14 is a graph plotting the gram loss of the HGAs after 24 hours at room temperature.
Figure 15:
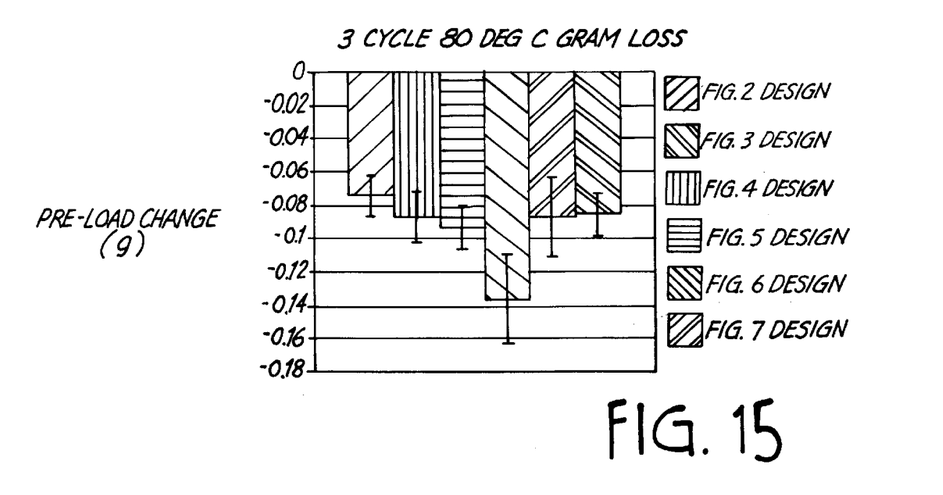
FIG. 15 is a graph plotting the gram loss of the HGAs after 24 hours where the HGAs were stored at 80° C. for eight hours.

As discussed above, the pre-load of the load beam is very tightly controlled. It is important that the pre-load not be adversely affected by any new design of the HGA. Pre-load is also referred to as the "gram load" because the units of force of the pre-load region are measured in grams. FIGS. 14 and 15 show the results of a gram loss test performed on 15 HGAs of each design configuration shown in FIGS. 2–7. To test the gram loss, the HGAs are loaded to a desired z-height and are put under load and stress (the pre-load). After a given amount of time, the HGAs are then measured to make sure that the pre-load is stable and that there has been no relaxation causing the pre-load to change.

FIG. 14 shows the gram loss after 24 hours at room temperature. FIG. 15 shows the gram loss after 24 hours at 80° C. The normal pre-load is about 0.5 grams, and the losses shown in FIGS. 14 and 15 are in the range of 0 to 0.14 grams, making the losses negligible. There is slightly more pre-load loss at the higher temperature (FIG. 15) because the polyamide and the flex circuit relax somewhat at the elevated temperature. However, all designs are within acceptable limits.

Although the present invention has been described with reference to preferred embodiments, workers skilled in the art will recognize that changes may be made in form and detail without departing from the spirit and scope of the invention.

What is claimed is:

1. A suspension for use in a disc drive having a data storage disc rotatable about an axis, the suspension comprising:
   a transducing head for transducing data with the disc and supported by a head gimbal assembly, wherein the head gimbal assembly comprises a load beam comprising a body, a base plate, and a load beam rail connecting the body to the base plate;
   a flexible interconnect circuit for providing an electrical connection to the transducing head, wherein the flexible interconnect circuit comprises a tail supporting traces and extending between the body and the base plate of the load beam; and
   means for damping a vibration of the head gimbal assembly formed of a substrate of the flexible interconnect circuit.

2. The suspension of claim 1 wherein the means for damping vibration of the head gimbal assembly comprises elbow extending off the load beam rail.

3. The suspension of claim 1 wherein the means for damping vibration of the head gimbal assembly comprises a damping strip located on the load beam rail.

4. The suspension of claim 1 wherein the damping strip includes a metal trace.

5. A flexible interconnect circuit for use on a load beam in a head gimbal assembly, the flexible interconnect circuit comprising:
   a substrate having electrical traces for connecting to a transducing head, wherein the substrate comprises a tail supporting traces and extending between a body and a base plate of the load beam; and
   a damper formed of the substrate of the flexible interconnect circuit for damping a natural resonance frequency of the head gimbal assembly, wherein the damper comprises a damping strip located at a rail portion of the load beam extending between the load beam body and the load beam base plate.

6. The flexible interconnect circuit of claim 5 wherein the damper comprises an elbow extending off the load beam rail.

7. The flexible circuit of claim 5 wherein the damper comprises a damping strip.

8. The flexible circuit of claim 7 wherein the damping strip includes metal traces to increase the stiffniess of the strip.

9. A head gimbal assembly comprising:
   a slider for supporting a transducing head for transducing data with a disc,
   a load beam supporting the slider, wherein the load beam comprises a body, a base plate, and a load beam rail connecting the body to the base plate; and
   a flexible interconnect circuit located on the load beam, the flexible interconnect circuit comprising a substrate, metal traces on the substrate for providing an electrical connection to the transducing head on the slider an integrated damper formed of the substrate of the flexible interconnect circuit; and a tail supporting traces and extending between the body and the base plate of the load beam.

10. The head gimbal assembly of claim 9 wherein the integrated damper comprises an elbow extending off the load beam rail.

11. The head gimbal assembly of claim 9 wherein the integrated damper comprises a damping strip on the load beam rail.

12. The head gimbal assembly of claim 11 wherein the damping strip connects to the tail on the load beam rail.

13. The head gimbal assembly of claim 11 wherein the damping strip includes metal traces.

14. A head gimbal assembly comprising:
   a slider for supporting a transducing head for transducing data with a disc,
   a load beam supporting the slider, the load beam having a body, a base plate, and a rail connecting the body to the base plate; and
   a flexible interconnect circuit located on the load beam, the flexible interconnect circuit comprising a substrate, metal traces on the substrate for providing an electrical connection to the transducing head on the slider, and an integrated damper formed from the substrate;
   the flexible interconnect circuit further comprising a tail supporting traces and extending between the body and the base plate of the load beam.

15. The head gimbal assembly of claim 14 wherein the integrated damper comprises a damping strip on the load beam rail.

16. The integrated damper of claim 15 wherein the damping strip connects to the tail on the load beam rail.

17. The head gimbal assembly of claim 15 wherein the damping strip includes metal traces.

* * * * *

UNITED STATES PATENT AND TRADEMARK OFFICE
CERTIFICATE OF CORRECTION

PATENT NO. : 6,728,073 B1
DATED : April 27, 2004
INVENTOR(S) : Richard August Budde et al.

It is certified that error appears in the above-identified patent and that said Letters Patent is hereby corrected as shown below:

Title page,
Item [54], Title, after "DAMPING" insert -- PROPERTIES --

Column 7,
Line 39, before "elbow" insert -- an --

Column 8,
Line 8, delete "stiffniess", insert -- stiffness --

Signed and Sealed this

Seventh Day of September, 2004

JON W. DUDAS
*Director of the United States Patent and Trademark Office*